(12) United States Patent
Omuro

(10) Patent No.: US 12,237,191 B2
(45) Date of Patent: Feb. 25, 2025

(54) WAFER HOLDER

(71) Applicant: DISCO CORPORATION, Tokyo (JP)

(72) Inventor: Yoshihiro Omuro, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 326 days.

(21) Appl. No.: 18/053,082

(22) Filed: Nov. 7, 2022

(65) Prior Publication Data

US 2023/0163005 A1 May 25, 2023

(30) Foreign Application Priority Data

Nov. 22, 2021 (JP) ................... 2021-189583

(51) Int. Cl.
*H01L 21/673* (2006.01)
(52) U.S. Cl.
CPC .. *H01L 21/67376* (2013.01); *H01L 21/67353* (2013.01); *H01L 21/67386* (2013.01)
(58) Field of Classification Search
CPC ......... H01L 21/67376; H01L 21/67353; H01L 21/67386; H01L 21/6838; H01L 21/68785; H01L 21/683; H01L 21/68735; B24B 41/06; B24B 41/068; Y10T 279/11; B25B 11/005; B28D 5/0094; B28D 7/046; B23Q 3/088; B23Q 1/032
USPC ............................ 269/21; 451/388, 288, 289
See application file for complete search history.

(56) References Cited

U.S. PATENT DOCUMENTS

| 11,279,005 B2 * | 3/2022 | Ishino ................. H01L 21/6838 |
| 2016/0170313 A1 * | 6/2016 | Funabashi ............ H01L 21/265 |
| | | 355/72 |

FOREIGN PATENT DOCUMENTS

JP 2021090028 A 6/2021

* cited by examiner

*Primary Examiner* — Robert F Neibaur
(74) *Attorney, Agent, or Firm* — Greer Burns & Crain Ltd.

(57) ABSTRACT

A wafer holder includes a holding base having a circular holding surface, including, on a side of the holding surface, an annular first groove and an annular second groove that is surrounded by the first groove, and internally including a plurality of first suction holes opening in a region located between the first groove and the second groove on the holding surface, a plurality of second suction holes opening in a region surrounded by the second groove on the holding surface, and a suction channel communicating to the first suction holes and the second suction holes and opening in a back surface on a side opposite to the holding surface. The first suction holes and the second section holes are configured in such a manner that the first suction holes each have a pressure loss greater than that at each of the second suction holes.

4 Claims, 6 Drawing Sheets

WAFER HOLDER

BACKGROUND OF THE INVENTION

Field of the Invention

The present invention relates to a wafer holder for use when sucking and holding a wafer.

Description of the Related Art

Chips of devices such as integrated circuits (ICs) or large scale integration (LSI) circuits are indispensable elements in various types of electronic equipment such as mobile phones and personal computers. Such chips are manufactured by dividing, for example, a disk-shaped wafer, on a surface of which a number of devices is formed, into individual regions including the devices, respectively.

The wafer is generally sliced from a cylindrical ingot with use of a blade saw, a wire saw, or the like. The wafer sliced in this manner is often warped. The wafer may also be warped due to internal stress induced along with the formation of devices. In manufacturing steps of chips, a need may therefore arise to process or transfer a warped wafer.

Nonetheless, a holding surface of a wafer holder (chuck table, transfer pad, or the like) for use when sucking and holding a wafer to process or transfer it is often planar. If a warped wafer is held with use of such a wafer holder, leakage may occur. If this is the case, a suction force that acts on the wafer decreases, thereby possibly making it impossible or difficult to hold the wafer.

In view of the foregoing problem, it has been proposed to dispose two O-rings of different diameters concentrically with each other with suction holes, which open in a holding surface of a wafer holder, being interposed between the two O-rings, and also arrange liquid supply means to form a liquid seal in a region outside the two O-rings between a wafer and the holding surface (see, for example, JP 2021-90028A). Use of such a wafer holder suppresses the occurrence of leakage, so that a suction force acting on a warped wafer increases. In this case, it is hence facilitated to hold the wafer in a planar state.

SUMMARY OF THE INVENTION

If liquid supply means is arranged in a wafer holder as mentioned above, however, the wafer holder is complicated in construction, leading to an increase in the manufacturing cost of the wafer holder. Further, to hold a wafer with use of this wafer holder, there is a need to operate the liquid supply means such that liquid is supplied, leading also to an increase in the manufacturing cost of chips to be manufactured by diving the wafer.

With the foregoing problems in view, the present invention has as an object thereof the provision of a wafer holder for use when holding a wafer, especially a warped wafer, the wafer holder having a simple construction and being capable of suppressing increases in its manufacturing cost and the manufacturing cost of chips to be manufactured by dividing the wafer.

In accordance with an aspect of the present invention, there is provided a wafer holder for use when sucking and holding a wafer. The wafer holder includes a holding base having a circular holding surface, including, on a side of the holding surface, an annular first groove and an annular second groove that is surrounded by the first groove, and internally including a plurality of first suction holes opening in a region located between the first groove and the second groove on the holding surface, a plurality of second suction holes opening in a region surrounded by the second groove on the holding surface, and a suction channel communicating to the first suction holes and the second suction holes and opening in a back surface on a side opposite to the holding surface, a first elastomer ring that is disposed in the first groove and protrudes in part from the holding surface, and a second elastomer ring that is disposed in the second groove and projects in part from the holding surface. The first suction holes and the second section holes are configured in such a manner that the first suction holes each have a pressure loss greater than that at each of the second suction holes.

Preferably, the suction channel may include communication portions radially extending in parallel with the holding surface, the first suction holes and the second suction holes may each linearly extend from a corresponding one of the communication portions of the suction channel to the holding surface in such a manner that the first suction holes and the second suction holes are each perpendicular to the holding surface, the first suction holes may each be formed in a cylindrical shape having a first diameter, and the second suction holes may each be formed in a cylindrical shape having a second diameter greater than the first diameter.

Also preferably, the first suction holes may be fewer in number than the second suction holes.

Also preferably, the second elastomer ring may be a V-ring.

The wafer holder of the present invention can also be used suitably when holding a wafer that has a diameter greater than an outer diameter of the first groove and that is curved to such an extent that, when the wafer is placed on a side of the holding surface of the holding base, the wafer comes into contact with the second elastomer ring but does not come into contact with the first elastomer ring. Described specifically, with this wafer holder, a suction force is allowed to act on the wafer, which is placed on the side of the holding surface of the holding base as described above, from an external suction source via the suction channel, the first suction holes, and the second suction holes.

Further, in this wafer holder, the first suction holes and the second section holes are configured in such a manner that the first suction holes each have a pressure loss greater than that at each of the second suction holes. A stronger suction force therefore acts in a space in a vicinity of a region surrounded by the second elastomer ring (in other words, the second groove) over the holding surface than in a space in a vicinity of a region on an outer side of the second elastomer ring over the holding surface.

When the wafer is to be held with use of this wafer holder, a region (central portion) of the wafer, which is located on an inner side of the second elastomer ring, is first strongly sucked. The central portion of the wafer is hence planarized to come into contact with the holding surface of the holding base while pressing the second elastomer ring into the second groove.

When the central portion of the wafer is planarized, a region (outer peripheral portion) of the wafer, the region surrounding the central portion, comes close to the holding surface. As a consequence, the outer peripheral portion of the wafer also comes into contact with or close to the first elastomer ring, thereby suppressing leakage through any clearance between the outer peripheral portion of the wafer and the first elastomer ring.

When the leakage through any clearance between the outer peripheral portion of the wafer and the first elastomer ring is suppressed, the suction force acting on the outer peripheral portion of the wafer increases. The outer peripheral portion of the wafer is hence planarized to come into contact with the holding surface of the holding base while pressing the first elastomer ring into the first groove. As a result, the wafer is held in a planar state by the wafer holder.

The above-mentioned wafer holder of this invention is simple in construction compared with a conventional wafer holder including liquid supply means or the like for forming a liquid seal, and therefore can suppress an increase in its manufacturing cost. In addition, there is no need to operate any special element (for example, the liquid supply means) when a wafer is held with use of the wafer holder of the present invention. It is hence possible to suppress an increase in the manufacturing cost of chips to be manufactured by dividing the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
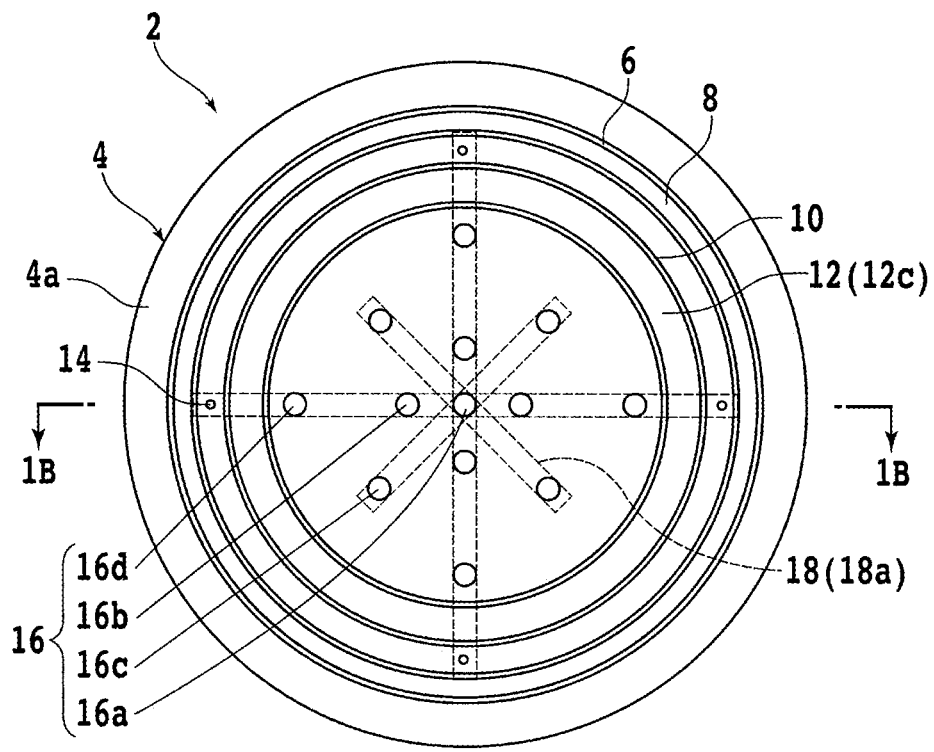
FIG. 1A is a top view schematically illustrating a wafer holder according to an embodiment of the present invention.
Figure 1B:
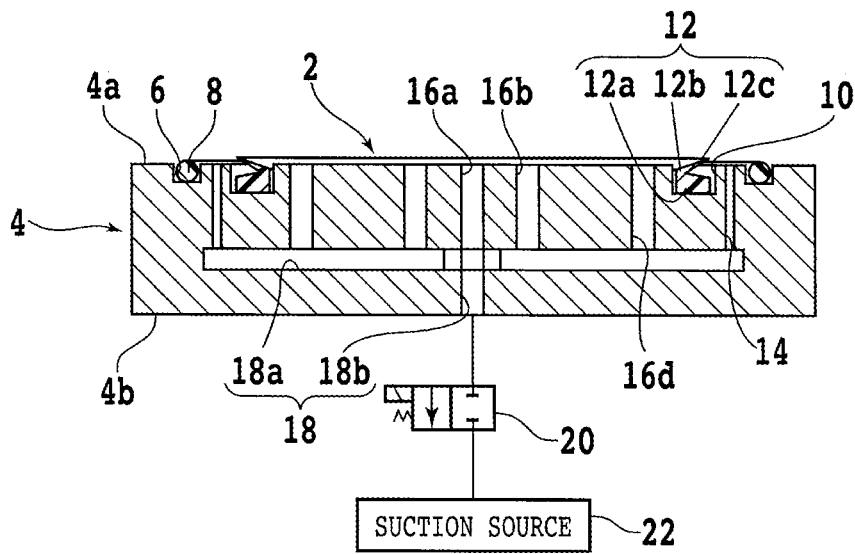
FIG. 1B is a cross-sectional view of the wafer holder taken along line 1B-1B in FIG. 1A.

With reference to the attached drawings, a description will be made about an embodiment of the present invention. FIG. 1A is a top view schematically illustrating a wafer holder 2 according to the embodiment of the present invention, and FIG. 1B is a cross-sectional view of the wafer holder 2 taken along line 1B-1B in FIG. 1A. For the sake of convenience, elements connected to the wafer holder 2 in FIG. 1B are each represented by a symbol or a block in a simplified manner.

The wafer holder 2 illustrated in FIGS. 1A and 1B has a disk-shaped holding base 4. The holding base 4 has a generally horizontal, circular holding surface 4a made, for example, from ceramics or the like. On a side of the holding surface 4a of the holding base 4, an annular groove (first groove) 6 is formed concentrically with an outer periphery of the holding surface 4a.

The holding base 4 is configured in such a manner that the holding surface 4a has a diameter longer than that of a wafer 11 (see FIG. 2A) to be mentioned below and the groove 6 has an outer diameter shorter than that of the wafer 11. In the groove 6, an annular seal sponge (first elastomer ring) 8 made, for example, from an elastic resin is disposed.

The seal sponge 8 has a circular cross-section of a diameter shorter than a width of the groove 6. The seal sponge 8 may be replaced by an O-ring made from an elastic resin. The seal sponge 8 has a thickness greater than a depth of the groove 6. The seal sponge 8 therefore protrudes at an upper end portion thereof from the holding surface 4a of the holding base 4.

On the side of the holding surface 4a of the holding base 4, an annular groove (second groove) 10 surrounded by the groove 6 is also formed. The groove 10 is concentric with the outer periphery of the holding surface 4a, and is deeper than the groove 6. In the groove 10, a V-ring (second elastomer ring) 12 is disposed.

The V-ring 12 has a main body portion 12a having a trapezoidal cross-section, each side of which is slightly shorter than a width of the groove 10, a hinge portion 12b disposed on an upper portion of a radially inner end of the main body portion 12a, and a lip portion 12c linearly extending from the hinge portion 12b to above a radially outer end of the main body portion 12a.

The V-ring 12 has a thickness greater than the depth of the groove 10. The lip portion 12c therefore projects from the holding surface 4a of the holding base 4. The position of a tip of the lip portion 12c is higher than the position of an upper end of the seal sponge 8.

Inside the holding base 4, a plurality (four in this embodiment) of suction holes (first suction holes) 14 and a plurality (thirteen in this embodiment) of suction holes (second suction holes) 16 are formed. The suction holes 14 open in a region of the holding surface 4a, the region being located between the groove 6 and the groove 10, and the suction holes 16 open in a region of the holding surface 4a, the region being surrounded by the groove 10.

Described specifically, the suction holes 14 are formed with their respective openings positioned at substantially equal intervals along a peripheral direction of the holding base 4. The suction holes 16 include a suction hole 16a opening in a center of the holding surface 4a, four suction holes 16b opening apart by a first distance from the center of the holding surface 4a, four suction holes 16c opening apart by a second distance, which is longer than the first distance, from the center of the holding surface 4a, and four suction holes 16d opening apart by a third distance, which is longer than the second distance, from the center of the holding surface 4a. The four suction holes 16b respectively have openings positioned at substantially equal intervals along the peripheral direction of the holding base 4. This applies equally to the four suction holes 16c and the four suction holes 16d.

The suction holes 14 and the suction holes 16 are each formed in a cylindrical shape, and extend over lengths equal to one another in such a manner that they are perpendicular to the holding surface 4a. The suction holes 16 each have a diameter greater than that of each suction hole 14.

Inside the holding base 4, a suction channel 18 is also formed. The suction channel 18 includes communication portions 18a and an opening portion 18b. The communication portions 18a extend in a radial pattern, and communicate to the suction holes 14 and the suction holes 16, respectively. The opening portion 18b extends perpendicular to the holding surface 4a, and opens in a back surface 4b on a side opposite to the holding surface 4a. The wafer holder 2 can be communicated to a suction source 22 such as an ejector via a tubing connected to the opening portion 18b of the suction channel 18, a valve 20, and the like.

The suction holes 14 and the suction holes 16 formed inside the holding base 4 of the wafer holder 2 are configured in such a manner that the suction holes 14 each have a pressure loss greater than that at each of the suction holes 16.

Described specifically, the pressure loss (Δp) at each suction hole 14 or 16 can be quantified by the following Darcy-Weisbach equation.

$$\Delta p = \lambda \times \frac{l}{d} \times \frac{\rho v^2}{2} \qquad [\text{Math. 1}]$$

In the above equation, λ means a friction factor in each suction hole 14 or 16, d means the diameter of each suction hole 14 or 16, l means the length of each suction hole 14 or 16, ρ means the density of fluid supplied to each suction hole 14 or 16, and v means the velocity of the fluid supplied to each suction hole 14 or 16.

Here, the suction holes 14 and 16 all have an equal friction factor because they are both formed inside the holding base 4. Further, the suction holes 14 and 16 are equal in length as mentioned above. Furthermore, the fluid supplied to each suction hole 14 or 16 is equal in both density and velocity because the suction holes 14 and 16 are all communicated to the suction channel 18.

On the other hand, the suction holes 16 are greater in diameter than the suction holes 14 as mentioned above. In the wafer holder 2, the suction holes 14 therefore each have a pressure loss greater than that at each of the suction holes 16.

Figure 2A:
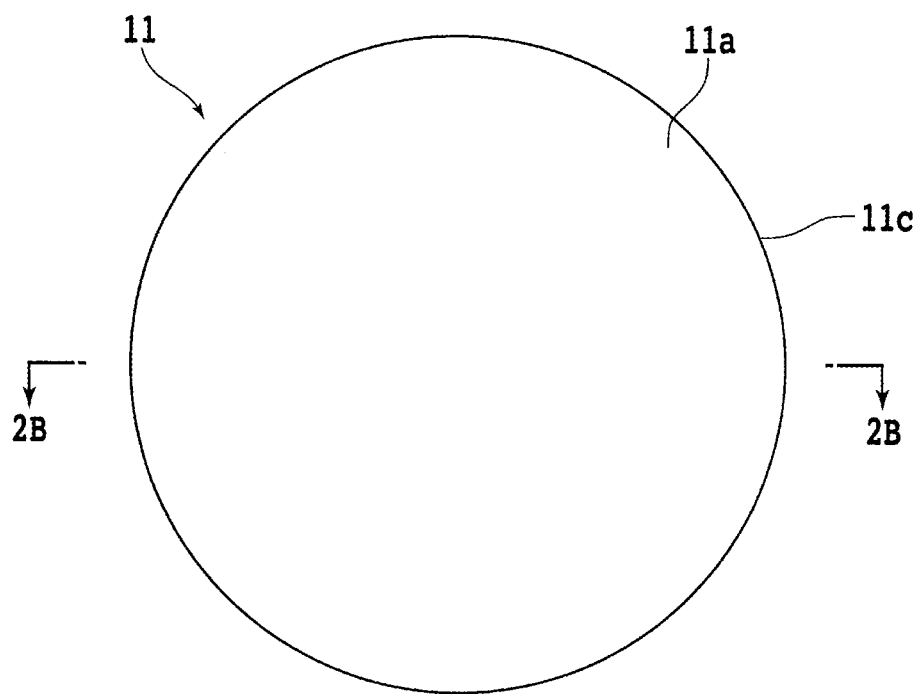
FIG. 2A is a top view schematically illustrating an example of a wafer to be held with use of the wafer holder of FIG. 1A.
Figure 2B:
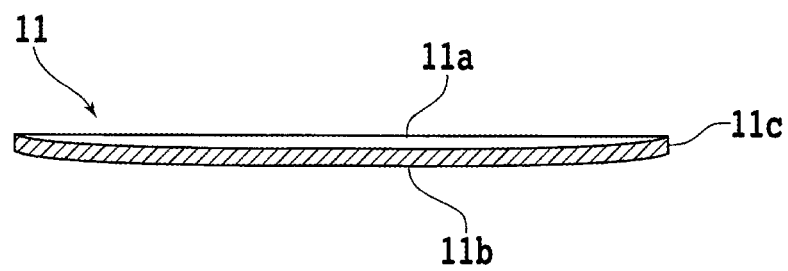
FIG. 2B is a cross-sectional view of the wafer taken along line 2B-2B in FIG. 2A.
Figure 3:
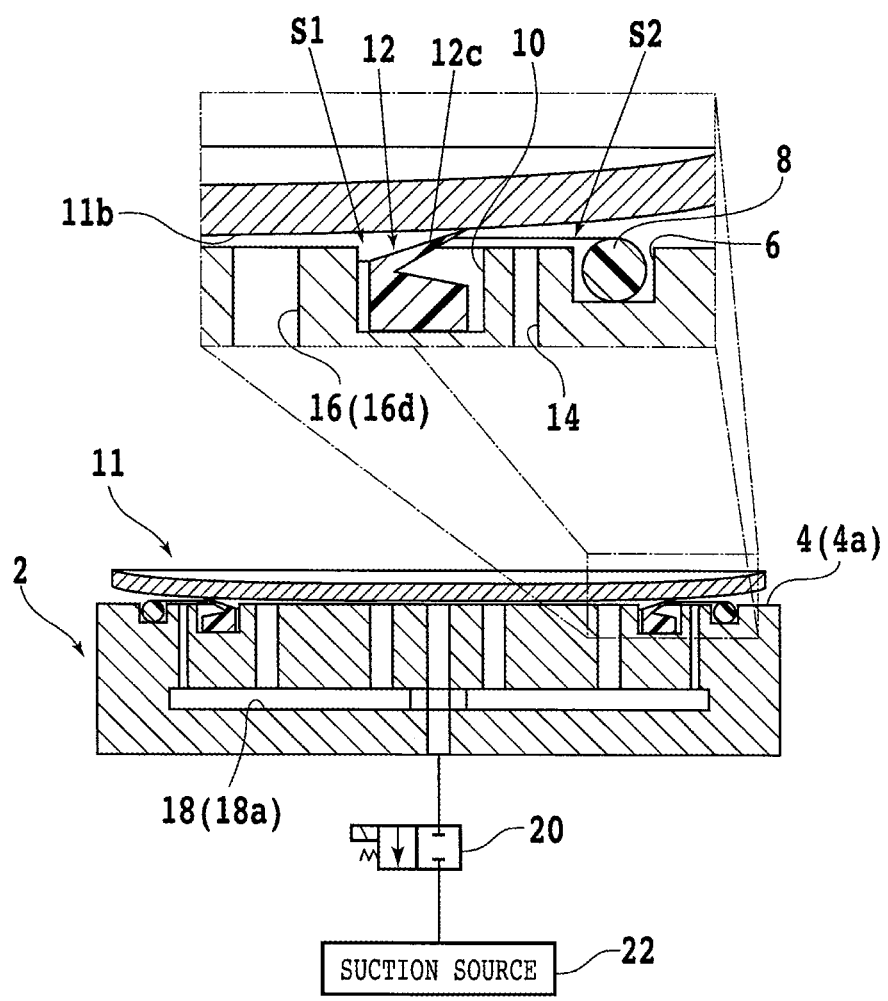
FIG. 3 is a cross-sectional view schematically illustrating how the wafer is held in a first stage with use of the wafer holder of FIG. 1A.

FIG. 2A is a top view schematically illustrating an example of the wafer 11 to be held with use of the wafer holder 2 of FIG. 1A, and FIG. 2B is a cross-sectional view of the wafer 11 taken along line 2B-2B in FIG. 2A.

The wafer 11 illustrated in FIGS. 2A and 2B is made from a single-crystal semiconductor material such as silicon (Si), silicon carbide (SiC), or gallium arsenide (GaAs). The wafer 11 is warped. Described specifically, the wafer 11 has one surface 11a curved to define an upward concavity, and the other surface 11b curved to define a downward convexity.

The wafer 11 may be chamfered at a side surface 11c thereof, or a notch or an orientation flat may be formed in the side surface 11c to indicate a specific crystal orientation. Devices such as ICs or LSI circuits may be formed on a side of the one surface 11a or on a side of the other surface 11b of the wafer 11.

FIGS. 3 to 6 are cross-sectional views schematically illustrating how the wafer 11 is held in first to fourth stages, respectively, with use of the wafer holder 2 of FIG. 1A. When the wafer 11 is held with use of the wafer holder 2, the wafer 11 is first placed, on the side of the other surface 11b, on the holding surface 4a of the holding base 4 in the first stage (see FIG. 3).

The lip portion 12c of the V-ring 12, the lip portion 12c projecting upward from the holding surface 4a, then comes at the tip thereof into contact with the other surface 11b of the wafer 11, whereby the V-ring 12 supports the wafer 11. At this time, the seal sponge 8 and the wafer 11 are apart from each other, because the other surface 11b of the wafer 11 is curved to bulge downward.

Accordingly, the suction holes 16 are in communication with a space S1 hermetically sealed by the wafer 11 and the V-ring 12, and the suction holes 14 are in communication with a space S2 opening through a clearance that is present between the wafer 11 and the seal sponge 8.

Figure 4:
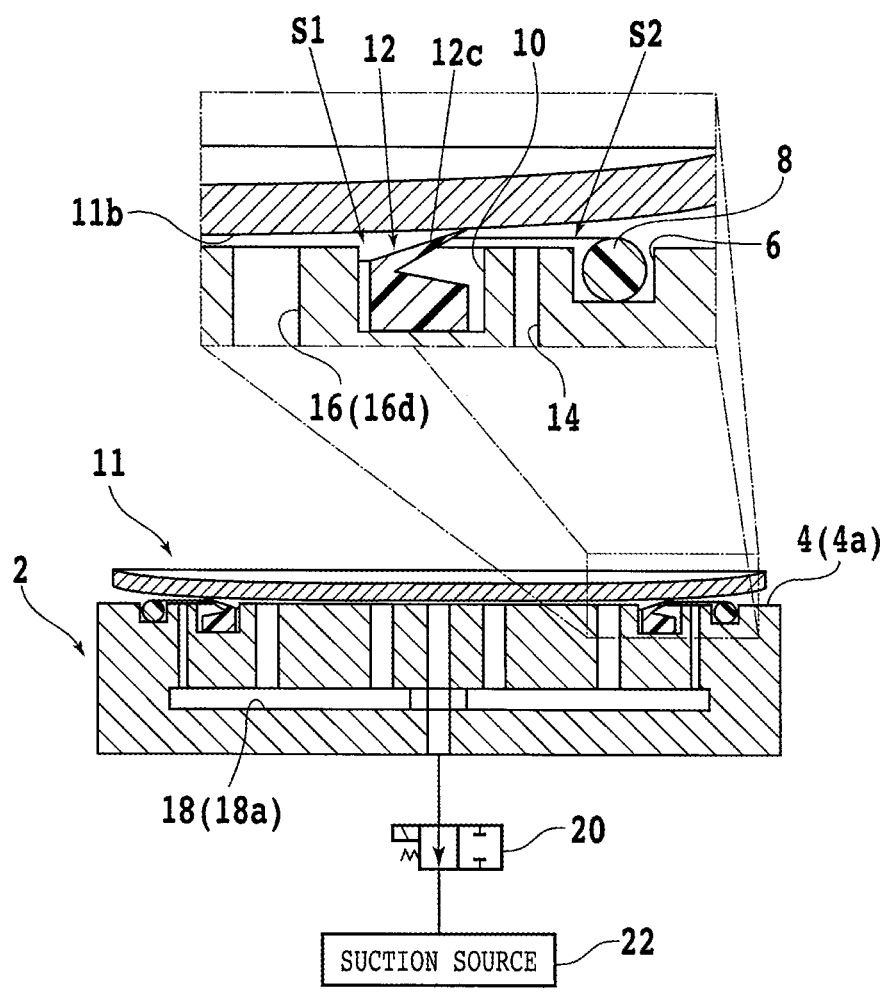
FIG. 4 is a cross-sectional view schematically illustrating how the wafer is held in a second stage with use of the wafer holder of FIG. 1A.
Figure 5:
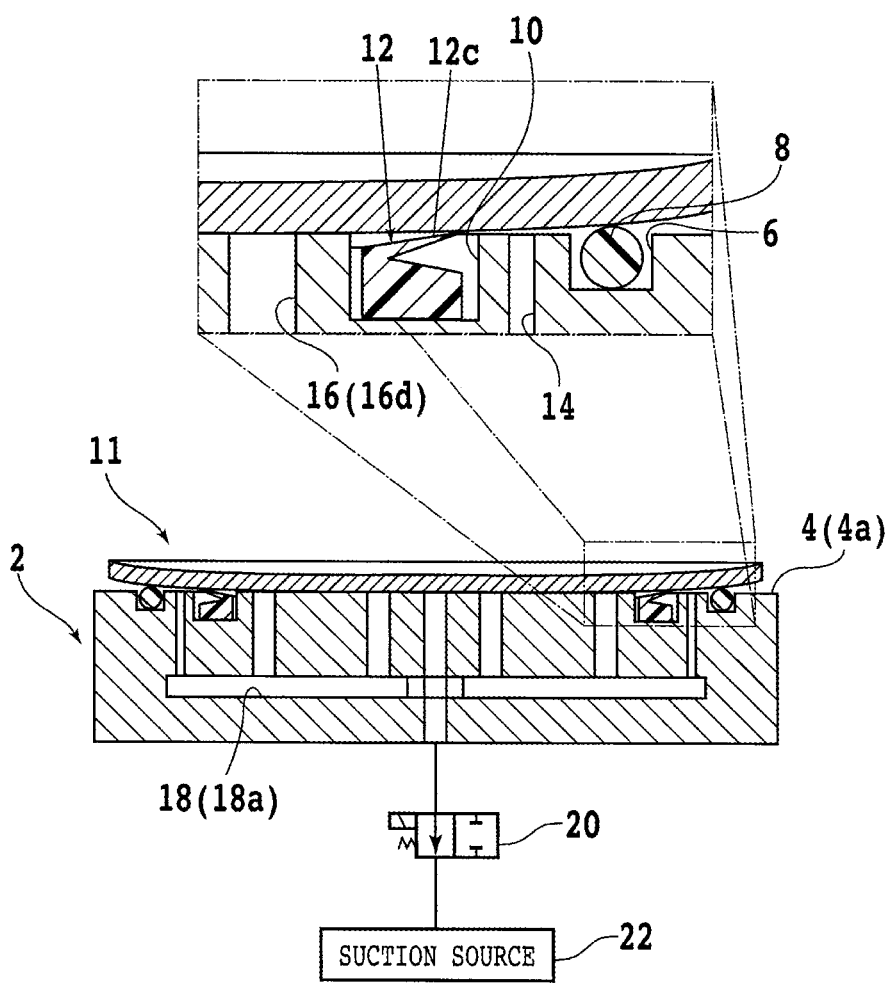
FIG. 5 is a cross-sectional view schematically illustrating how the wafer is held in a third stage with use of the wafer holder of FIG. 1A.

In the second stage, the valve 20 is next brought into an open state with the suction source 22 kept in an operated state (see FIG. 4). As a consequence, a suction force acts in the space S1 and space S2 via the suction channel 18, the suction holes 14, and the suction holes 16. That is, a suction force for bringing the other surface 11b of the wafer 11 into contact with the holding surface 4a of the holding base 4 acts on the wafer 11.

In the wafer holder 2, the suction holes 14 each have a pressure loss greater than that at each of the suction holes 16 as mentioned above. A suction force that acts in the space S1 is therefore stronger than that acting on the space S2.

In the third stage, the wafer 11 is first sucked strongly at a region (central portion) located on an inner side of the V-ring 12. The lip portion 12c of the V-ring 12 is therefore pressed into the groove 10 by the central portion of the wafer 11. As a result, the central portion of the wafer 11 is planarized to come into contact with the holding surface 4a of the holding base 4 (see FIG. 5).

When the central portion of the wafer 11 is planarized, a region (outer peripheral portion) that surrounds the central portion of the wafer 11 also comes close to the holding surface 4a of the holding base 4. As a consequence, the outer peripheral portion of the wafer 11 comes into contact or close to the seal sponge 8, thereby suppressing leakage through any clearance between the outer peripheral portion of the wafer 11 and the seal sponge 8.

The suppression of the leakage through any clearance between the outer peripheral portion of the wafer 11 and the seal sponge 8 allows a stronger suction force to act on the outer peripheral portion of the wafer 11.

Figure 6:
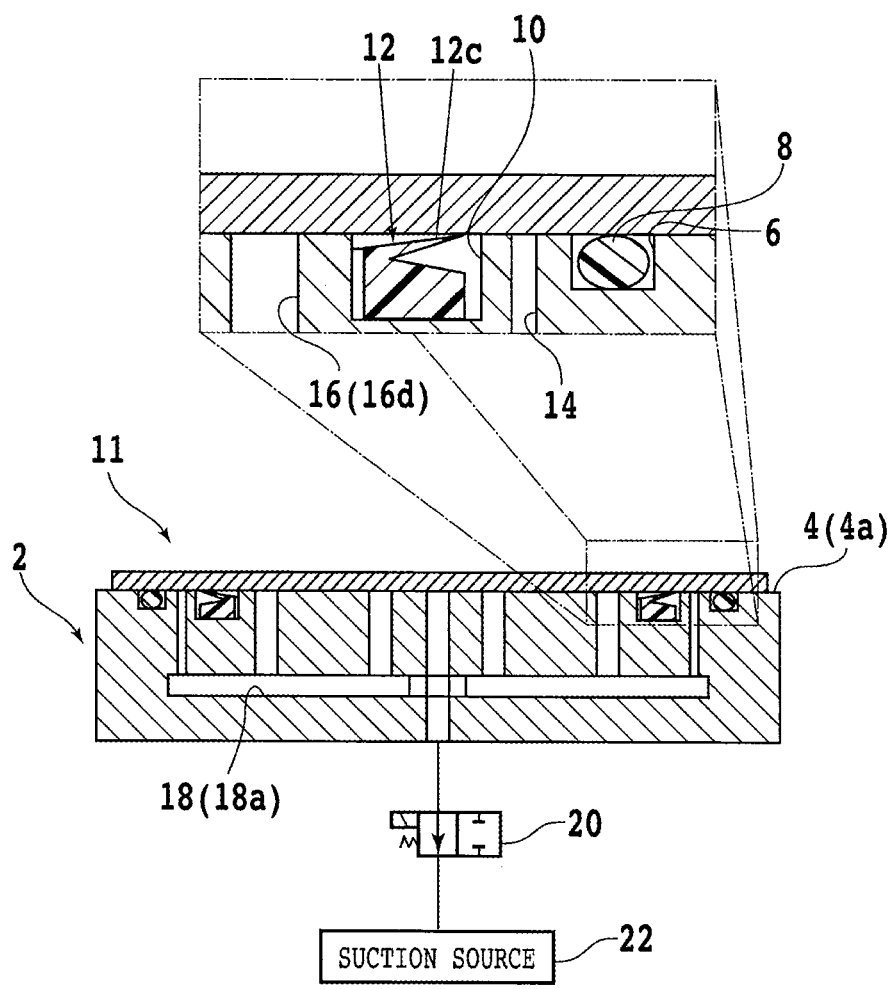
FIG. 6 is a cross-sectional view schematically illustrating how the wafer is held in a fourth stage with use of the wafer holder of FIG. 1A.

In the fourth stage, the seal sponge 8 is therefore pressed into the groove 6 by the outer peripheral portion of the wafer 11 in such a manner that the seal sponge 8 has an elliptical cross-section (see FIG. 6). Further, the lip portion 12c of the V-ring 12 is pressed radially inward into the groove 10 by the outer peripheral portion of the wafer 11. As a result, the outer peripheral portion of the wafer 11 is planarized to come into contact with the holding surface 4a of the holding base 4.

The above-mentioned wafer holder 2 is simple in construction compared with a conventional wafer holder including liquid supply means or the like for forming a liquid seal, and therefore can suppress an increase in its manufacturing cost. In addition, there is no need to operate any special element (for example, liquid supply means) when the wafer 11 is to be held with use of the wafer holder 2. It is hence possible to suppress an increase in the manufacturing cost of chips to be manufactured by dividing the wafer 11.

In the wafer holder 2, the V-ring 12 may be replaced by another elastomer ring such as a seal sponge or an elastic O-ring. In other words, insofar as an element that can support the wafer 11 and can be pressed into the groove 10 is disposed in the groove 10 of the wafer holder 2, no particular limitation is imposed on the element. In the present invention, however, the disposition of the V-ring 12 in the groove 10 is preferred in that, owing to the high position of its upper end, the V-ring 12 can hermetically seal the space S1 with ease and can be pressed into the groove 10 with relative ease.

In the wafer holder 2, the seal sponge 8 may also be replaced by another elastomer ring such as a V-ring. In other words, insofar as an element that can be pressed into the groove 6 is disposed in the groove 6 of the wafer holder 2, no particular limitation is imposed on the element. In the present invention, however, the disposition of the seal sponge 8 or an O-ring in the groove 6 is preferred in that the wafer 11 can be planarized with ease to a region very near to an outer periphery of the wafer 11.

In the wafer holder 2, the suction holes 14 may be more in number than the suction holes 16. In the present invention, however, the suction holes 14 are preferably fewer in number than the suction holes 16 in that the planarization of the central portion of the wafer 11 is facilitated.

Insofar as the wafer holder 2 is configured in such a manner that the suction holes 14 each have a pressure loss greater than that at each of the suction holes 16, no particular limitation is imposed on the constructions of the suction holes 14 and suction holes 16.

In the wafer holder 2, such grooves that communicate to the suction holes 14 and/or the suction holes 16 may be formed on the side of the holding surface 4a of the holding base 4. The formation of such grooves facilitates allowing a suction force to act uniformly on the wafer 11.

Moreover, the constructions, procedures, and the like according to the above-mentioned embodiment can be practiced with changes or modifications made as appropriate to such extent as not departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer holder for use when sucking and holding a wafer, the wafer holder comprising:
   a holding base having a circular holding surface, including, on a side of the holding surface, an annular first groove and an annular second groove that is surrounded by the first groove, and internally including a plurality of first suction holes opening in a region located between the first groove and the second groove on the holding surface, a plurality of second suction holes opening in a region surrounded by the second groove on the holding surface, and a suction channel in common with the first suction holes and the second suction holes and communicating therewith and opening in a back surface on a side opposite to the holding surface;
   a first elastomer ring that is disposed in the first groove and protrudes in part from the holding surface; and
   a second elastomer ring that is disposed in the second groove and projects in part from the holding surface,
   wherein the first suction holes and the second section holes are configured in such a manner that the first suction holes each have a pressure loss greater than that at each of the second suction holes;
   wherein the first suction holes are fewer in number than the second suction holes.

2. The wafer holder according to claim 1, wherein the suction channel includes communication portions radially extending in parallel with the holding surface,
   the first suction holes and the second suction holes each linearly extend from a corresponding one of the communication portions of the suction channel to the holding surface in such a manner that the first suction holes and the second suction holes are each perpendicular to the holding surface,
   the first suction holes are each formed in a cylindrical shape having a first diameter, and
   the second suction holes are each formed in a cylindrical shape having a second diameter greater than the first diameter.

3. The wafer holder according to claim 2, wherein the second elastomer ring is a V-ring.

4. The wafer holder according to claim 1, wherein the second elastomer ring is a V-ring.

* * * * *